US012791163B2

(12) United States Patent
Narendran et al.

(10) Patent No.: US 12,791,163 B2
(45) Date of Patent: Nov. 10, 2026

(54) 3D PRINTABLE LENS STRUCTURE

(71) Applicant: Rensselaer Polytechnic Institute, Troy, NY (US)

(72) Inventors: Nadarajah Narendran, Clifton Park, NY (US); Akila Shan Udage, Troy, NY (US)

(73) Assignee: Rensselaer Polytechnic Institute, Troy, NY (US)

(*) Notice: Subject to any disclaimer, the term of this patent is extended or adjusted under 35 U.S.C. 154(b) by 0 days.

(21) Appl. No.: 18/274,225

(22) PCT Filed: Jan. 26, 2022

(86) PCT No.: PCT/US2022/013798

§ 371 (c)(1),
(2) Date: Jul. 26, 2023

(87) PCT Pub. No.: WO2022/164839

PCT Pub. Date: Aug. 4, 2022

(65) Prior Publication Data

US 2024/0093856 A1 Mar. 21, 2024

Related U.S. Application Data

(60) Provisional application No. 63/141,859, filed on Jan. 26, 2021.

(51) Int. Cl.
*F21V 5/04* (2006.01)
*B33Y 80/00* (2015.01)
(Continued)

(52) U.S. Cl.
CPC .............. *F21V 5/045* (2013.01); *B33Y 80/00* (2014.12); *F21V 5/04* (2013.01); *F21V 7/0091* (2013.01);
(Continued)

(58) Field of Classification Search
CPC . F21V 5/045; F21V 5/04; F21V 5/048; F21V 7/0091; F21V 13/04; F21V 5/004;
(Continued)

(56) References Cited

U.S. PATENT DOCUMENTS 2,215,900 A * 9/1940 Bitner ..................... F21V 13/04 362/333
6,295,162 B1 * 9/2001 Miyata ................. G03B 21/625 359/453
(Continued)

FOREIGN PATENT DOCUMENTS

CN 206145464 U * 5/2017
CN 113757572 A * 12/2021
(Continued)

OTHER PUBLICATIONS

International Search Report and The Written Opinion of the International Searching Authority, International Application No. PCT/US2022/013798, mailed Apr. 26, 2022.

*Primary Examiner* — William N Harris
(74) *Attorney, Agent, or Firm* — Barclay Damon LLP; Anthony P. Gangemi

(57) ABSTRACT

One embodiment provides a lens structure. The lens structure includes a backend. The backend includes a backend back surface and a backend front surface. The backend is configured to receive a luminous flux from a light source and to redirect the received luminous flux onto a lens. The redirected luminous flux is configured to increase a luminous efficacy.

20 Claims, 4 Drawing Sheets

(51) Int. Cl.

| | |
|---|---|
| ***F21V 7/00*** | (2006.01) |
| ***F21Y 115/10*** | (2016.01) |
| ***G02B 3/00*** | (2006.01) |
| ***G02B 19/00*** | (2006.01) |
| ***H10H 20/855*** | (2025.01) |

(52) U.S. Cl.
CPC ....... *G02B 3/0025* (2013.01); *G02B 19/0014* (2013.01); *G02B 19/0066* (2013.01); *H10H 20/855* (2025.01); *F21Y 2115/10* (2016.08); *G02B 2003/0093* (2013.01)

(58) Field of Classification Search
CPC ...... F21V 5/005; B33Y 80/00; F21Y 2115/10; G02B 2003/0093; G02B 3/0025; G02B 19/0014; G02B 19/0066; G02B 6/0036; G02B 6/0058; H01L 33/58; H10H 20/855
See application file for complete search history.

(56) References Cited

U.S. PATENT DOCUMENTS

| | | | | |
|---|---|---|---|---|
| 6,755,556 | B2 * | 6/2004 | Gasquet | F21S 43/26 362/337 |
| 7,196,460 | B2 * | 3/2007 | Kling | H05B 3/009 313/116 |
| 8,068,288 | B1 * | 11/2011 | Pitou | F21V 5/04 359/743 |
| 8,523,407 | B2 * | 9/2013 | Huang | F21K 9/61 362/335 |
| 8,746,923 | B2 | 6/2014 | Ashdown et al. | |
| 9,099,575 | B2 | 8/2015 | Medendorp, Jr. et al. | |
| 9,447,299 | B2 | 9/2016 | Schut et al. | |
| 9,720,245 | B2 | 8/2017 | Kautz et al. | |
| 9,765,949 | B2 | 9/2017 | Shen et al. | |
| 9,891,369 | B2 | 2/2018 | Wimmer et al. | |
| 9,952,448 | B2 | 4/2018 | Vazquez | |
| 10,003,776 | B2 | 6/2018 | Damberg et al. | |
| 10,012,832 | B2 | 7/2018 | Guenter et al. | |
| 10,086,575 | B2 | 10/2018 | Rodriguez et al. | |
| 10,288,775 | B1 | 5/2019 | Keith et al. | |
| 10,331,111 | B2 | 6/2019 | Cluckers | |
| 10,462,453 | B2 | 10/2019 | Koerber et al. | |
| 10,696,210 | B2 * | 6/2020 | Snyder | B60Q 1/143 |
| 10,816,149 | B2 | 10/2020 | Boonekamp et al. | |
| 10,838,219 | B2 * | 11/2020 | Zhou | F21V 5/045 |
| 11,306,894 | B2 * | 4/2022 | Cheng | F21V 5/045 |
| 11,512,827 | B2 * | 11/2022 | Yoshida | F21V 9/40 |
| 11,519,582 | B2 * | 12/2022 | Chen | F21S 43/15 |
| 2007/0127253 | A1 * | 6/2007 | Kawashima | F21S 41/255 362/509 |
| 2008/0137196 | A1 * | 6/2008 | Hsu | G02B 3/0056 359/599 |
| 2008/0137200 | A1 * | 6/2008 | Hsu | G02B 5/0278 359/599 |
| 2009/0279295 | A1 | 11/2009 | Van Der Poel | |
| 2012/0044700 | A1 * | 2/2012 | Chen | F21K 9/232 362/311.02 |
| 2014/0071703 | A1 * | 3/2014 | Motomura | F21S 43/33 362/511 |
| 2015/0036339 | A1 | 2/2015 | Ashdown et al. | |
| 2015/0167926 | A1 | 6/2015 | Yu | |
| 2015/0378086 | A1 | 12/2015 | Feng et al. | |
| 2016/0049561 | A1 * | 2/2016 | Daeschner | H10H 20/856 362/296.01 |
| 2016/0215956 | A1 | 7/2016 | Smith et al. | |
| 2017/0261186 | A1 | 9/2017 | Meir et al. | |
| 2019/0242554 | A1 | 8/2019 | Lee | |
| 2019/0260927 | A1 | 8/2019 | Thiele et al. | |
| 2019/0331314 | A1 * | 10/2019 | Engelen | F21V 7/0091 |
| 2020/0109835 | A1 * | 4/2020 | Latsis | F21V 5/04 |
| 2021/0116103 | A1 * | 4/2021 | Bu | F21K 9/69 |
| 2021/0193886 | A1 * | 6/2021 | Yu | H10H 20/855 |

FOREIGN PATENT DOCUMENTS

| | | | | |
|---|---|---|---|---|
| DE | 102019126884 | A1 * | 4/2021 | B29D 11/00432 |
| JP | 2003209291 | A * | 7/2003 | |
| JP | 2007157561 | A * | 6/2007 | F21S 48/1154 |
| JP | 2016505347 | A | 2/2016 | |
| JP | 2020077551 | A * | 5/2020 | |
| KR | 20090024102 | A | 3/2009 | |
| WO | 2020123924 | A1 | 6/2020 | |

* cited by examiner

3D PRINTABLE LENS STRUCTURE

CROSS REFERENCE TO RELATED APPLICATION(S)

This application claims the benefit of U.S. Provisional Application No. 63/141,859, filed Jan. 26, 2021, which is incorporated by reference as if disclosed herein in its entirety.

GOVERNMENT LICENSE RIGHTS

This invention was made with government support under award number EE0008722, awarded by the Department of Energy. The government has certain rights in the invention.

FIELD

The present disclosure relates to lens structure, in particular to, a three-dimensional (3D) printable lens structure.

BACKGROUND

Light emitting diode (LED) lighting fixtures (i.e., luminaires) generally contain several components. Such components may include, but are not limited to, a light source (e.g., LED, LED array, etc.), a lens structure (e.g., reflector, lens, diffuser, etc.), electronics (e.g., driver, sensors, controllers, etc.), a housing to encase the electronics, and other components (e.g., heat sink). Luminous efficacy (lumens/watt) of a luminaire, broadly defined as light (i.e., luminous flux in units of lumens) output divided by power input, is related to characteristics of the luminaire. Characteristics of the luminaire may include, but are not limited to, an amount of luminous flux emitted by the light source, output beam width of the light source, capture volume of a corresponding lens structure, geometry of the luminaire (e.g., distance between light source and lens, dimension (i.e., size) of lens, orientation of lens relative to light source), characteristics of lens light receiving surface, etc.

The efficacy may be further related to relationships between selected characteristics, e.g., output beam width of the light source versus capture volume of a corresponding lens structure. In other words, light output from the light source that does not reach the lens is not then captured by the lens and directed to a target lighting application. Such light output may then be lost, resulting a reduction in luminous efficacy for the light fixture.

SUMMARY

In some embodiments, there is provided a lens structure. The lens structure includes a backend. The backend includes a backend back surface and a backend front surface. The backend is configured to receive a luminous flux from a light source and to redirect the received luminous flux onto a lens. The redirected luminous flux is configured to increase a luminous efficacy.

In some embodiments of the lens structure, the backend front surface is coupled to and contiguous with a back surface of the lens.

In some embodiments of the lens structure, the backend back surface is configured to reflect at least a portion of the received luminous flux onto a back surface of the lens.

In some embodiments of the lens structure, the backend back surface is configured to refract at least a portion of the received luminous flux and, via total internal reflection, is configured to transmit the refracted luminous flux into the lens.

In some embodiments, the lens structure further includes a lens. The lens includes a lens front surface and a lens back surface.

In some embodiments of the lens structure, the lens is configured to receive a portion of the luminous flux from the light source directly from the light source.

In some embodiments of the lens structure, the lens front surface includes a plurality of front surface features configured to enhance a characteristic of light output.

In some embodiments of the lens structure, the lens back surface is coupled to and contiguous with the backend front surface.

In some embodiments, there is provided a luminaire. The luminaire includes a light source, a lens, and a backend. The lens includes a lens back surface configured to receive an input luminous flux and an opposing lens front surface configured to emit an output luminous flux. The backend includes a backend back surface and a backend front surface. The backend is configured to receive a luminous flux from a light source and to redirect the received luminous flux onto a lens. The redirected luminous flux is configured to increase a luminous efficacy.

In some embodiments of the luminaire, the backend front surface is coupled to and contiguous with a back surface of the lens.

In some embodiments of the luminaire, the backend back surface is configured to reflect at least a portion of the received luminous flux onto the back surface of the lens.

In some embodiments of the luminaire, the backend back surface is configured to refract at least a portion of the received luminous flux and, via total internal reflection, is configured to transmit the refracted luminous flux into the lens.

In some embodiments of the luminaire, the lens is configured to receive a portion of the luminous flux from the light source directly from the light source.

In some embodiments of the luminaire, the lens front surface includes a plurality of front surface features configured to enhance a characteristic of light output of the luminaire.

In some embodiments of the luminaire, each front surface feature corresponds to a geometric shape. Each geometric shape is selected from the group including a linear shape, a curved shape, an ellipsoidal shape, a parabolic shape, a free-form shape, and/or a combination thereof.

In some embodiments of the luminaire, each front surface feature is selected from the group including a bump, a portion of a bump, a dimple, a portion of a dimple, and/or a combination thereof.

In some embodiments of the luminaire, the lens back surface is coupled to and contiguous with the backend front surface.

In some embodiments of the luminaire, the light source includes at least one light emitting diode (LED).

In some embodiments, the luminaire further includes a layer coupled to the front surface of the lens. The layer is configured to provide a smooth outer surface.

In some embodiments of the luminaire, the lens and the backend are produced in a three-dimensional (3D) printing process.

BRIEF DESCRIPTION OF DRAWINGS

The drawings show embodiments of the disclosed subject matter for the purpose of illustrating features and advantages of the disclosed subject matter. However, it should be understood that the present application is not limited to the precise arrangements and instrumentalities shown in the drawings, wherein.

DESCRIPTION

Generally, there is disclosed herein a three-dimensional (3D) printable lens structure. In some embodiments, the 3D printable lens structure may be included in a luminaire. A particular configuration of the lens structure may be related to a lighting application of the luminaire. In one nonlimiting example, the lighting application may correspond to illuminating a portion of a parking lot. It may be appreciated that parking lot lighting may be configured to maximize efficacy as well as uniformity. It may be further appreciated that efficacy may be increased by capturing a relatively larger portion of light output (i.e., luminous flux) from a light source. A 3D printable lens structure, according to the present disclosure, may include a lens and a backend. The backend is configured to receive emitted luminous flux from the light source and to redirect at least some of the received luminous flux onto a lens. The lens includes a lens back surface configured to receive an input luminous flux and an opposing lens front surface configured to emit an output luminous flux. The lens may then be configured to receive emitted luminous flux from the light source directly from the light source and indirectly via the backend. The indirectly received emitted luminous flux is configured to increase the luminous flux output of the luminaire (for a same input power) and thus increase a corresponding luminous efficacy.

In an embodiment, there is provided a lens structure. The lens structure includes a backend. The backend includes a backend back surface and a backend front surface. The backend is configured to receive a luminous flux from a light source and to redirect the received luminous flux onto a lens. The redirected luminous flux is configured to increase a luminous efficacy.

In an embodiment, there is provided a luminaire. The luminaire includes a light source, a lens, and a backend. The lens includes a lens back surface configured to receive an input luminous flux and an opposing lens front surface configured to emit an output luminous flux. The backend includes a backend back surface and a backend front surface. The backend is configured to receive a luminous flux from the light source and to redirect the received luminous flux onto the lens. The redirected luminous flux configured to increase a luminous efficacy of the luminaire.

Figure 1A:
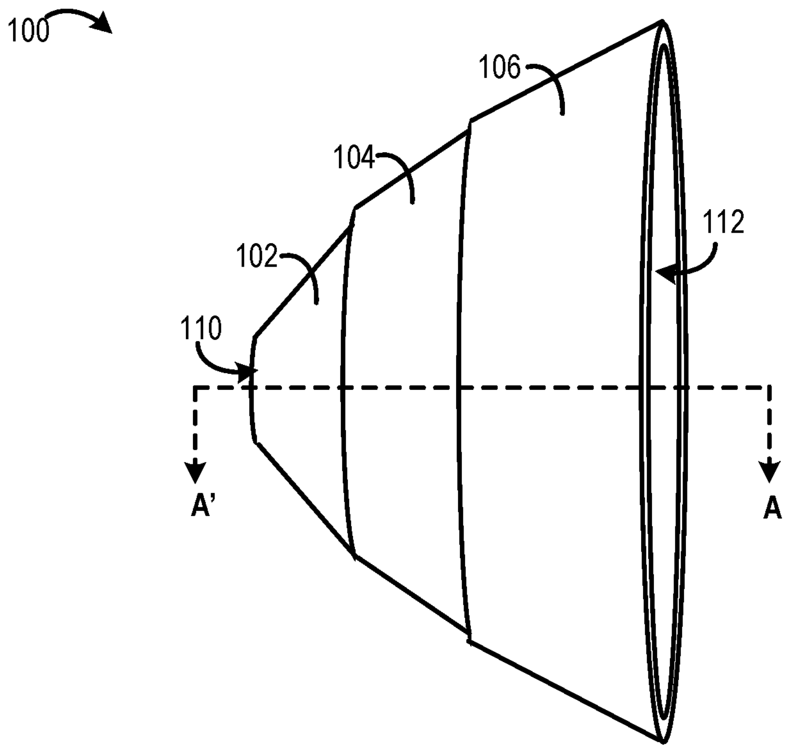
FIG. 1A is a sketch illustrating an isometric view of an example luminaire that includes a lens structure, according to several embodiments of the present disclosure.

FIG. 1A is a sketch illustrating an isometric view of an example luminaire 100 that includes a lens structure, according to several embodiments of the present disclosure. Luminaire 100 includes a backend 102, lens 104, and a lens holder 106. One or more of the backend 102, lens 104, and/or lens holder 106 may be produced in a 3D printing process. The backend 102, lens 104, and/or lens holder 106 may each may be 3D printed using one or more materials. The materials may include, but are not limited to, a synthetic polymer (e.g., acrylic, polyethylene, polypropylene, polycarbonate, etc.), a metal (e.g., copper, zinc, brass, aluminum, etc.), glass, and/or a combination thereof. Each material may be selected based, at least in part, on operational characteristics, e.g., transparency, reflectivity, etc.

Example luminaire 100 has a generally conical shape with a generally circular cross-section. However, this disclosure is not limited in this regard. Luminaire shapes may include, but are not limited to, conical, circular, rectangular, square, ellipsoidal, parabolic, free-form, etc. Luminaire 100 has a luminaire back surface 110 and an opposing luminaire front surface 112. Luminous flux may generally enter luminaire 100 at or near the luminaire back surface 110 and corresponding luminous flux may be emitted from luminaire front surface 112.

Figure 1B:
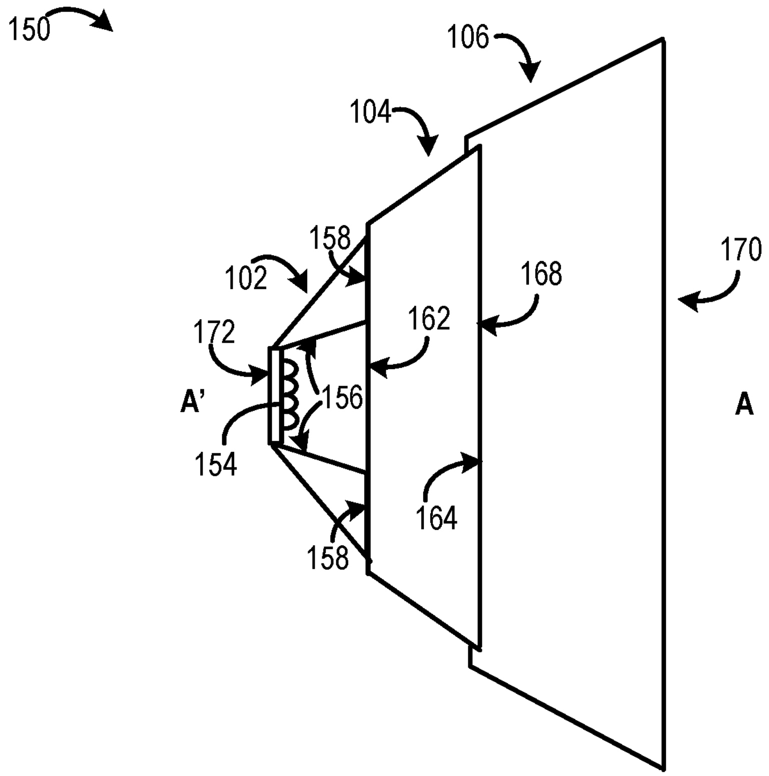
FIG. 1B is a cross-section view of the example luminaire of FIG. 1A.

FIG. 1B is a cross-section A-A' view 150 of the example luminaire of FIG. 1A. Example luminaire 150 includes the backend 102, the lens 104, and the lens holder 106. Example luminaire 150 further includes a light source 154. In this example 150, the light source 154 corresponds to an LED array. However, this disclosure is not limited in this regard. LED array configurations may vary according to number and/or type of LEDs and/or physical configuration of the LEDs in the array (e.g., a size of the LED array, angle(s) of the LEDs). In some embodiments, a design of the backend 102 may be related to a particular configuration of a corresponding LED array.

Backend 102 includes a backend back surface 156 and a backend front surface 158. Lens 104 includes a lens back surface 162 and an opposing lens front surface 164. Lens holder 106 includes a lens holder back surface 168 and a lens holder front surface 170. The backend front surface 158 is adjacent to and/or contiguous with the lens back surface 162. The lens front surface 164 is adjacent to and/or contiguous with the lens holder back surface 168.

In operation, light source 154 may be configured to emit luminous flux that may then be received by the backend 102. The backend 102 may then be configured to redirect at least a portion of the received light (i.e., luminous flux) to the lens 104. In an embodiment, the backend 102, e.g., backend back surface 156, may be configured to reflect at least a portion of received luminous flux from the light source 154 onto the back surface 162 of the lens 104. In an embodiment, the backend 102, e.g., backend back surface 156, may configured to refract at least a portion of received luminous flux and, via total internal reflection, transmit the refracted luminous flux into the lens 104. In some embodiments, the backend 102 may be configured to provide structural support to the lens 104.

The lens 104, e.g., lens back surface 162, is configured to receive light directly from the light source 154 and/or indirectly via the backend 102. The lens 104 may be further configured to emit the received light out the front surface 164 of the lens. The received light may then be emitted out front surface 170 of the lens holder 106. Thus, indirect and/or direct light may be received by the backend 102 and/or lens 104, reflected and/or refracted, and emitted out of the luminaire 150 via the lens holder 106.

Thus, light emitted by the light source 154 may enter the luminaire 150 at or near the backend the back surface 156 and may exit the luminaire at or near the front surface 170 of the lens holder 106.

In some embodiments, the lens holder 106 and/or the front surface of the lens holder 170 may correspond to smooth, flat surface, configured to facilitate cleaning the corresponding luminaire. In other words, a flat, smooth surface may be relatively easy to clean. In some embodiments, the luminaire may include a smooth, flat back surface 172, configured to facilitate cleaning the corresponding luminaire.

Thus, a luminaire may include a lens, a backend, a light source and, in some embodiments, a lens holder. In some embodiments, a front surface of the backend may be contiguous with a back surface of the lens. The backend may be configured to redirect at least a portion of the light output of the light source into the lens, as described herein.

Figure 2A:
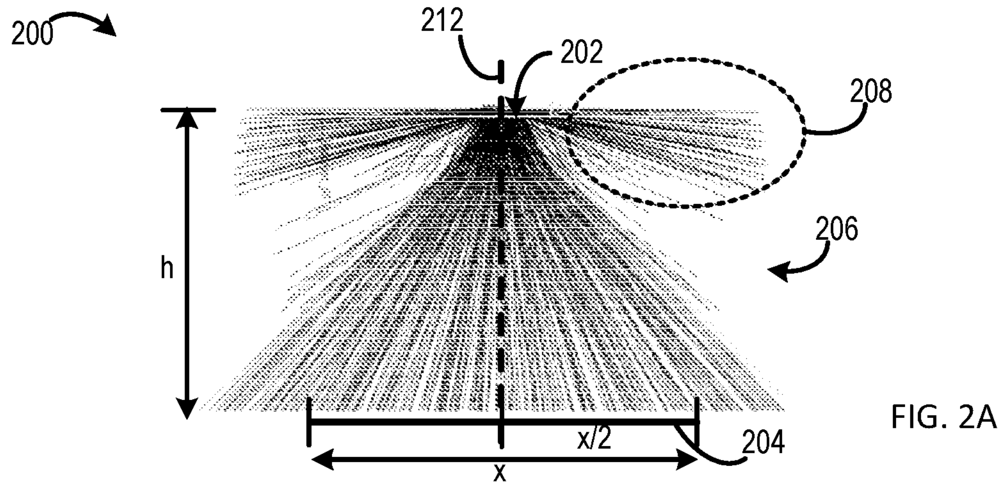
FIG. 2A is a sketch illustrating one example of light output distribution from a light source.
Figure 2B:
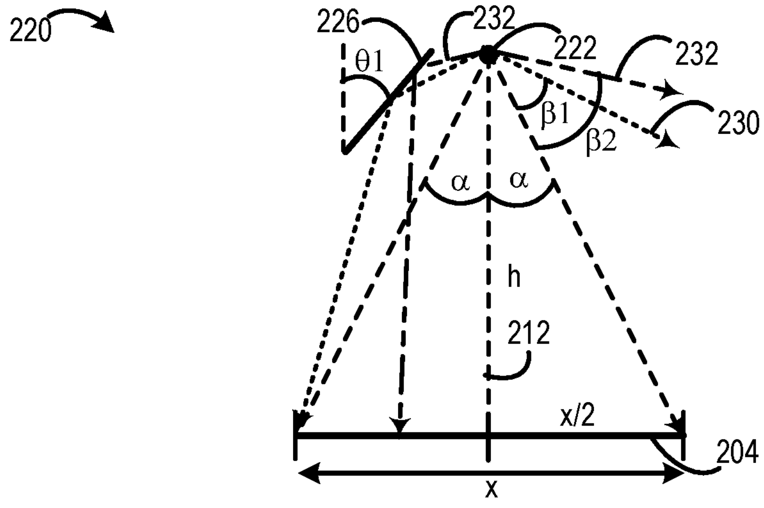
FIGS. 2B and 2C are sketches illustrating operation of a backend, according to several embodiments of the present disclosure.
Figure 2C:
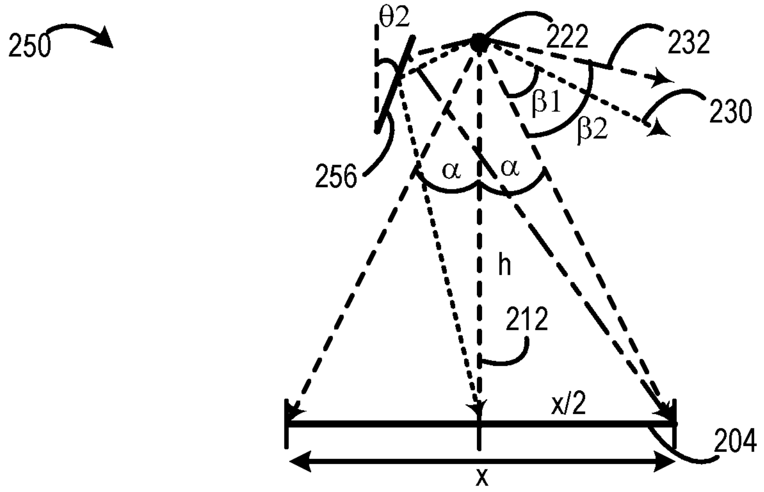

FIG. 2A is a sketch 200 illustrating one example of a light output distribution from a light source (e.g., an LED or LED array). Sketch 200 is configured to illustrate beam width of one example light source. FIGS. 2B and 2C are sketches 220, 250 illustrating light ray diagrams representing operation of a backend, according to several embodiments of the present disclosure. FIGS. 2A through 2C may be best understood when considered together.

Turning first to FIG. 2A, sketch 200 includes a light source 202 and a target illumination area 204 positioned relative to the light source 202. The light source 202 is positioned at a distance, h, along a normal 212, from the target illumination area 204. The target illumination area 204 may correspond to a cross section of a lens, i.e., a target area in the luminaire for the light output from the light source 202. It may be appreciated that a lighting application may generally have an associated application target area that corresponds to an ultimate lighting target of the luminaire, e.g., an area in a parking lot.

It may be appreciated that, in these examples 200, 220, 250, the target illumination area 204 is linear. A corresponding lens back surface may be linear, curved (e.g., circular, ellipsoidal, parabolic) or free-form. In some embodiments, the lens back surface may have a plurality of regions and may thus include a combination of surface geometries, as described herein. The target illumination area 204 may correspond to a cross-section of the corresponding lens.

Sketch 200 further includes a light output distribution corresponding to luminous flux emitted by the light source 202. The light output distribution includes two general regions of light output 206, 208 that may be emitted by the light source 202. A first region of light output 206 may correspond to a solid cone with a base cross-section greater than a width, x, of the target illumination area 204. Thus, a fraction of light output 206 is configured to reach the target illumination area 204 and a remaining portion of the first region of the light output 206 may be lost. The fraction of light output 206 that reaches the target illumination area 204 may be included in a capture volume of a corresponding lens back surface. The remaining portion of the first region of the light output 206 that may be lost may not be included in a capture volume of the lens back surface, i.e., may be outside the target illumination area 204. It may be appreciated that adjusting the position of the lens back surface, and thus the target illumination area 204, relative to the light source 202 to reduce h, may better align the light distribution of the first region 206 with the capture volume of the lens back surface. For example, the lens may be repositioned closer to the light source or the light source may be repositioned closer to the lens to reduce h. Such better alignment of light output distribution and capture volume may result in less first region light output loss and a corresponding increase in efficacy.

A second region of light output 208 may not reach the target illumination area 204 at all. In this example, the light source 202 may be considered wide angle. Repositioning the lens back surface closer to the light source may not significantly affect the amount of loss. The efficacy of example 200 is thus reduced from a possible maximum because of the lost light output.

Turning now to FIGS. 2B and 2C, sketches 220, 250 each includes a light source 222, the target illumination area 204, and a respective backend reflective surface 226, 256. In one example, a first backend reflective surface 226 may correspond to backend back surface 156 of FIG. 1B. In another example, a second backend reflective surface 256 may correspond to backend back surface 156 of FIG. 1B. Sketches 220, 250 include a plurality of dotted lines representing light rays corresponding to respective boundaries of regions of emitted light, i.e., ray diagrams. The backend reflective surfaces 226, 256 are simplified for illustrative purposes and are configured to illustrate geometric orientation of the backend reflective surfaces 226, 256, relative to the light source 222 and the target illumination area 204 and corresponding lens back surface.

As is known, a target lighting application may be defined by an area of a surface to be illuminated. Target lighting applications may include, but are not limited to, outdoor lighting, indoor lighting, lighting a picture on a wall, lighting a desk in an office space, work surface lighting, automotive lighting (e.g., headlamps), etc. Each application may have corresponding target application illumination characteristics.

In the sketches 220, 250, the target illumination area 204 corresponds to the surface to be illuminated. In this example, the target illumination area 204 is generally rectangular, e.g., square, with each side having length, x. In another example, e.g., for a curved lens back surface, the illumination area may correspond to a planar area bounded by an edge of the lens. In other words, although the illumination area is shown as rectangular (for ease of description), the analysis applies to other lens back surface geometries, and are within the scope of the present disclosure.

A light source, e.g., light source 222, may be positioned a distance, h, from the target illumination area 204. An angle, $\alpha$, may then be determined as $\alpha=\tan^{-1}(x/2/h)=\tan^{-1}(x/2h)$. It may be appreciated that in a parking lot light application, for example, the dimensions of h and x may generally be on the order of tens of feet while in a luminaire lighting application, the dimensions of h and x may be on the orders of ones or tenths of inches. The angle, a, may then be used as a design parameter for the lighting application. The angle, $\alpha$, is related to a capture volume (e.g., solid cone) of the target illumination area 204 and corresponding lens back surface.

Each light source, e.g., light source 222, may generally emit light with an intensity distribution that can be analyzed with respect to the target illumination area. Beam-forming may then be implemented based, at least in part, on the analysis, configured to improve the illuminance of the target illumination area for a given light source and corresponding intensity distribution. For example, an LED light source may be generally wide angle. A wide angle light source, e.g., light source 222, may emit light rays at angles that include angles $\alpha+\beta1$, e.g., light ray 230, and $\alpha+\beta2$, e.g., light ray 232. In one nonlimiting example, the angle $\alpha+\beta1$ may be included in the first region of light output 206, and the angle $\alpha+\beta2$ may be included in the second region of light output 208. In other words, while the target illumination area corresponds to a cone angle, $\alpha$, the LED light source may emit light at an angle greater than α. Light emitted at angles greater than α may then not illuminate the target illumination area 204 and may be lost. To reduce the amount of light lost, the backend, e.g., backend reflective surface 226, 256, may be configured to redirect emitted light toward the target illumination area 204.

A first backend reflective surface 226 is oriented at a first backend reflective surface angle θ1 relative to a normal 212 to the target illumination area 204. A second backend reflective surface 256 is oriented at a second backend reflective surface angle θ2 relative to the normal 212 to the target illumination area 204. It may be appreciated that the orientation of the backend reflective surface relative to the normal affects an amount of light that may be redirected to the target illumination area and, thus, the lens back surface. In the examples 220, 250, θ1 is greater than θ2 resulting in a relatively smaller amount of redirection of the emitted light by the first backend surface 226 relative to the redirection by the second backend surface 256.

Additionally or alternatively, the backend reflective surfaces 226, 256 may be positioned closer to or farther away from the light source 222. Such a difference in relative position may affect an amount of light redirected to the target illumination area 204. It may be appreciated that a shape of the backend reflective surface 226, 256 may affect an amount of light redirected to the target illumination surface. The backend reflective surface shape may be linear or nonlinear (e.g., curved, parabolic, elliptical, rectangular, or free-form).

Thus, the backend may be configured to increase, i.e., improve, the portion of the light emitted by a light source that reaches the target lighting surface. Increasing the amount of light reaching the target lighting surface may then improve the efficacy of the luminaire.

Figure 3A:
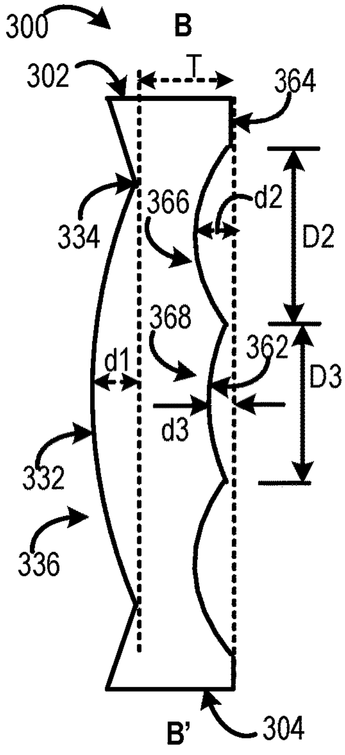
FIGS. 3A through 3C illustrate a cross-section view, a back view, and the front view of one example lens, according to several embodiments of the present disclosure.
Figure 3B:
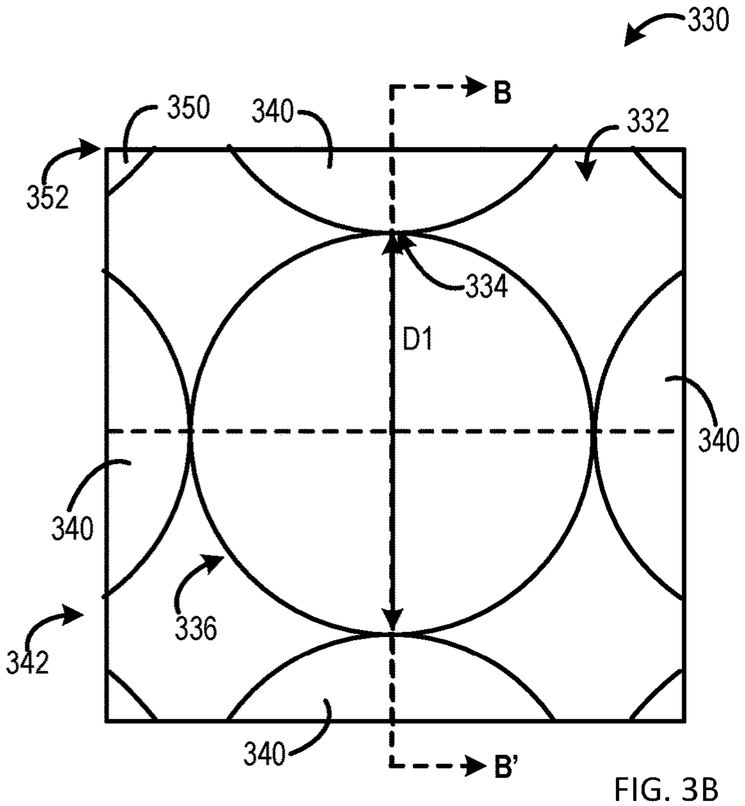
Figure 3C:
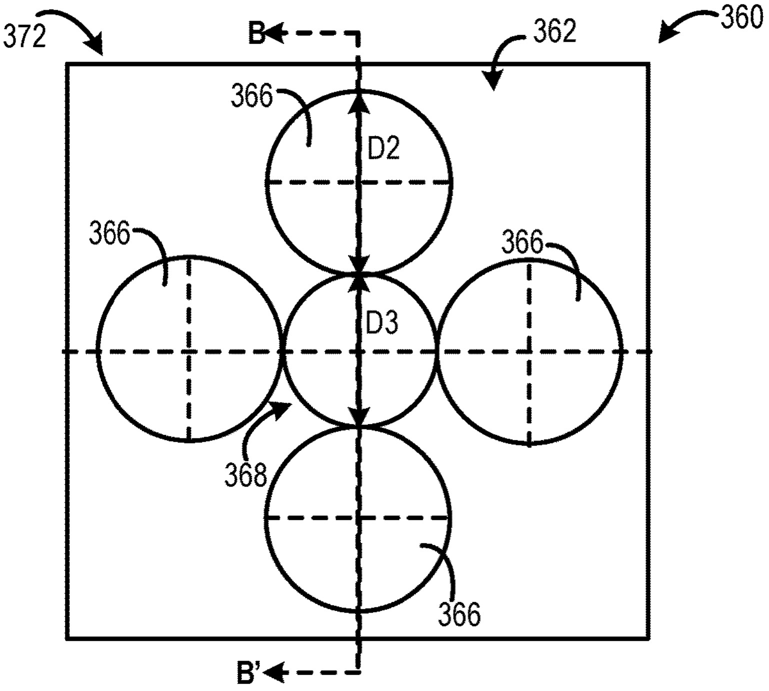

FIGS. 3A through 3C illustrate a cross-section B-B' view, a back view, and the front view of one example lens 300, according to several embodiments of the present disclosure. FIG. 3A is a side view corresponding to a cross-section B-B' of the example lens 300. FIG. 3B is a back view 330 of the lens 300 of FIG. 3A, illustrating a back surface 332. FIG. 3C is a front view 360 of the lens 300 of FIG. 3A, illustrating a front surface 362. FIGS. 3A through 3C may be best understood when considered together.

Lens 300 includes the front surface 362 and opposing back surface 332. The front surface 362 is coupled to the back surface 332 by a first side surface 302 and an opposing second side surface 304. In this example 300, the side surfaces 302, 304 are linear, however, this disclosure is not limited in this regard. In other examples, the side surfaces may be nonlinear, e.g., curved, parabolic, ellipsoidal, free-form, etc. The lens 300 has a general thickness, T, measured from a linear portion, e.g., linear portion 364, of the front surface 362 to a boundary, i.e., an edge 334, of a dimple on the back surface 332, as described herein.

The back surface 332 and the front surface 362 each includes respective surface features configured to enhance at least one characteristic of light (i.e., luminous flux) ultimately emitted by a luminaire that includes lens 300. Light characteristics may include, but are not limited to, efficacy, a target amount of luminous flux output from the luminaire, uniformity of illuminance at a target application surface, etc. In an embodiment, the surface features may correspond to geometric shapes. The geometric shapes may be linear, curved, ellipsoidal, parabolic, free-form, and/or a combination thereof. In one nonlimiting example, the surface features may include, but are not limited to, a bump, a portion of a bump, a dimple, a portion of a dimple, a plurality of bumps (and/or portions of bumps), a plurality of dimples (and/or portions of dimples), and/or a combination thereof. As used herein, a bump and a dimple each corresponds to a curved surface. The curved surface may be concave or convex. A radius of curvature of a bump may be smaller than a radius of curvature of a dimple. A length of a surface arc of a dimple may be greater than a length of an arc of a bump. A distance between the curved surface and a corresponding chord (i.e., secant) may generally differ between a bump and a dimple.

In one nonlimiting example, the back surface 332 may include a back surface feature 336, generally centered on the back surface 332 corresponding to a dimple that has a diameter, D1, and a depth, d1. The back surface feature 336 may be convex. In another example, the front surface 362 may include a plurality of front surface features 366, and a second front surface feature 368. The front surface features 366, 368 may be concave. The front surface features 366, 368 may correspond to bumps. Each bump 366 has a diameter, D2, and a depth, d2. A second bump 368 has a diameter, D3, and a depth, d3.

In this example, the back surface 332 includes one circular geometric feature 336 generally centered on the surface, a plurality of similar arcs 340, generally centered on each side, e.g. side 342, of the back surface 332, and a plurality of relatively smaller arc portions 350, generally positioned at a respective corner, e.g., corner 352. Continuing with this example, the front surface 362 includes one relatively smaller circular geometric feature 368 generally centered on the front surface 362, and a plurality of relatively larger circular geometric features 366, generally centered on each side, e.g. side 372, of the front surface 362.

In operation, the surface features of the lens 300 are configured enhance operation of a luminaire, e.g., luminaire 100 of FIGS. 1A and 1B, that includes lens 300. The front surface features may be related to beam forming configured to facilitate, for example, illumination uniformity of a target application illumination area, e.g., portion of a parking lot. The back surface features may be related to efficacy that may also affect illumination uniformity. In an embodiment, at least one back surface feature, e.g., dimple 336, may be configured to couple to a backend, e.g., backend 102. For example, backend front surface 158 may be configured to be contiguous with dimple 336 surface, when lens 300 and backend 102 are included in a luminaire, e.g., luminaire 100. The contiguous backend front surface and lens back surface may then be configured to facilitate total internal reflection of luminous flux received by the backend from the light source within the lens. Facilitating total internal reflection may further improve efficacy of the luminaire.

Figure 4A:
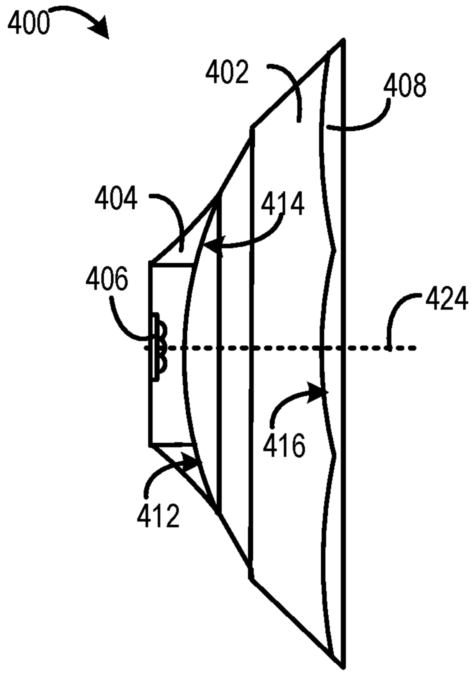
FIGS. 4A through 4C illustrate one example luminaire, according to one embodiment of the present disclosure.
Figure 4B:
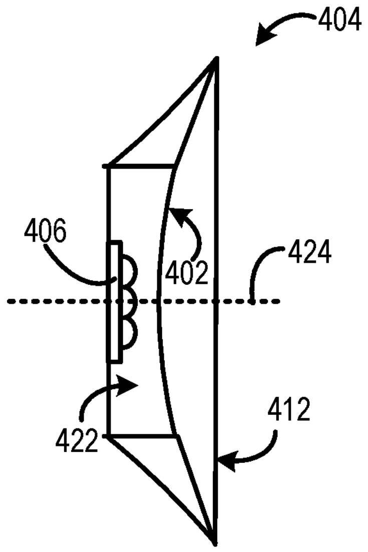
Figure 4C:
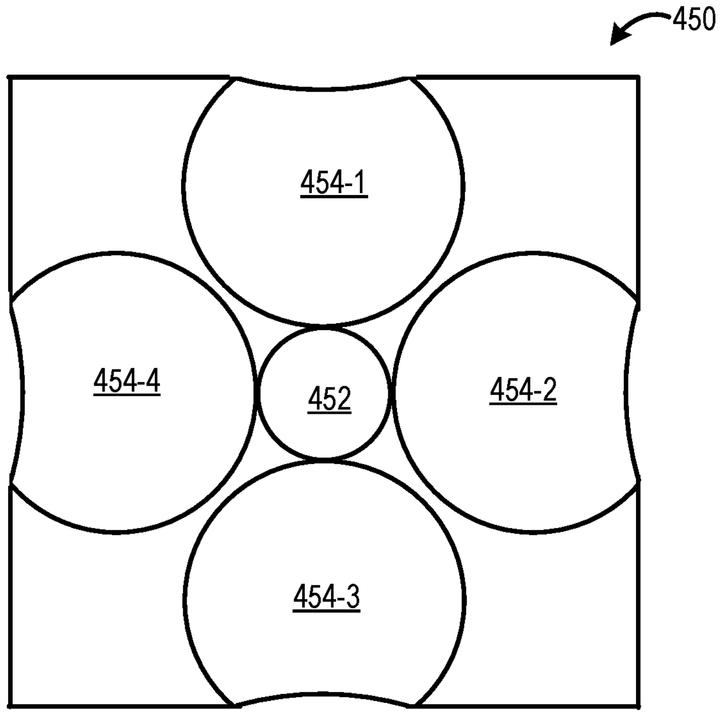

FIGS. 4A through 4C illustrate one example luminaire 400, according to one embodiment of the present disclosure. FIG. 4A is a side view of the example luminaire 400. FIG. 4B is a detail view of the backend 404 of luminaire 400 of FIG. 4A, illustrating geometric features. FIG. 4C is a front view 450 of the luminaire 400 of FIG. 4A. FIGS. 4A through 4C may be best understood when considered together.

Luminaire 400 includes a lens 402 coupled to, and contiguous with, a backend 404. The lens 402 and backend 404 may thus correspond to a lens structure, as described herein. In this example 400, the backend 404 may correspond to a ring holder. A front surface 412 of the backend 404 is contiguous with a back surface 414 of the lens 402. Luminaire 400 further includes a light source, e.g., LED array 406. In this example 400, the LED array 406 may include a plurality of LEDs configured generally as a plus sign. The light source 406 is configured to emit luminous flux. A first portion of the luminous flux may be directly received by the back surface 414 of the lens 402. The first portion may thus correspond to direct luminous flux. A second portion of the luminous flux may be incident on one or more surfaces of the backend 404. The backend 404 may be configured to redirect at least some of the second portion onto the back surface 414 of the lens 402. The second portion may thus correspond to indirect luminous flux. The lens 402 may then receive the direct luminous flux and the indirect luminous flux and is configured to emit an output luminous flux a front surface 416 of the lens 402. The output luminous flux may then include at least a portion of the received direct luminous flux and indirect luminous flux.

In some embodiments, luminaire 400 may include a layer 408 coupled to the front surface 416 of the lens 402. The layer 408 may be configured to provide a smooth outer surface to the luminaire 400, configured to facilitate cleaning, as described herein.

Turning now to FIG. 4B, the backend 404 includes one or more surfaces configured to redirect luminous flux received from the light source 406 onto the back surface of the lens 402. In one nonlimiting example, backend 404 includes a backend surface 422 oriented generally perpendicular to the front surface 416 of the lens 402. With reference to FIG. 2B, the backend surface 422 may be oriented with angle θ1 at or near zero. However, this disclosure is not limited in this regard. In another example, the backend surface 422 may be oriented with nonzero angle θ1. The backend surface 422 may be positioned generally symmetrically with respect to a center line 424, corresponding to a center of the front surface 416 of lens 402. One or more geometric features of the backend 404 (e.g., shape, dimension, orientation, etc.) may be selected or determined based, at least in part, on characteristics of the lens 402 (e.g., shape, dimensions, material, etc.).

Turning now to FIG. 4C, the front view 450 illustrates one example of the front surface 416 of lens 402. The front surface 416 includes one or more surface features configured to enhance at least one characteristic of luminous flux, as described herein, emitted by a luminaire that includes lens 402. In this example 450, the surface features include a bump 452, and at least a portion of each of four dimples 454-1, 454-2, 454-3, 454-4, as described herein. The four dimple portions 454-1, 454-2, 454-3, 454-4 may be arranged generally symmetrically around the center bump 452. However, this disclosure is not limited in this regard.

In operation, the surface features of the lens 402, e.g., front surface 450, and features of backend 404 are configured enhance operation of the luminaire 400. The front surface features may be related to beam forming configured to facilitate, for example, illumination uniformity of a target application illumination area. The backend 404 may be related to efficacy that may also affect illumination uniformity. For example, backend front surface 412 may be configured to be contiguous with the back surface of the lens 414. The contiguous backend front surface and lens back surface may then be configured to facilitate total internal reflection of luminous flux received by the backend 412 from the light source 406 within the lens 402. Facilitating total internal reflection may further improve efficacy of the luminaire.

Generally, there is disclosed herein a 3D printable lens structure. In some embodiments, the 3D printable lens structure may be included in a luminaire. A 3D printable lens structure, according to the present disclosure, may include a lens and a backend. The backend is configured to receive emitted light from the light source and to redirect at least some of the received light onto the lens. The lens may then be configured to receive emitted light from the light source directly from the light source and indirectly via the backend. The indirectly received emitted light is configured to increase the light output of the luminaire (for a same input power) and thus increase a corresponding luminous efficacy.

The terms and expressions which have been employed herein are used as terms of description and not of limitation, and there is no intention, in the use of such terms and expressions, of excluding any equivalents of the features shown and described (or portions thereof), and it is recognized that various modifications are possible within the scope of the claims. Accordingly, the claims are intended to cover all such equivalents.

Various features, aspects, and embodiments have been described herein. The features, aspects, and embodiments are susceptible to combination with one another as well as to variation and modification, as will be understood by those having skill in the art. The present disclosure should, therefore, be considered to encompass such combinations, variations, and modifications.

What is claimed is:

1. A lens structure comprising:

a lens comprising a lens front surface and a lens back surface, wherein the lens front surface comprises two or more concave circular dimples, and wherein the lens back surface comprises a convex circular dimple; and a backend comprising a backend back surface and a backend front surface, the backend configured to receive a luminous flux from a light source and to redirect the received luminous flux onto the lens, the redirected luminous flux configured to increase a luminous efficacy, wherein the backend front surface is adjacent to and contiguous with the convex circular dimple of the lens back surface.

2. The lens structure of claim 1, wherein the backend back surface is configured to reflect at least a portion of the received luminous flux onto the lens back surface.

3. The lens structure of claim 1, wherein the backend back surface is configured to refract at least a portion of the received luminous flux and, via total internal reflection, is configured to transmit the refracted luminous flux into the lens.

4. The lens structure of claim 1, wherein the lens is configured to receive a portion of the luminous flux from the light source directly from the light source.

5. The lens structure of claim 1, wherein the lens front surface comprises a plurality of front surface features configured to enhance a characteristic of light output.

6. The lens structure of claim 1, wherein the lens front surface comprises four concave circular dimples.

7. The lens structure of claim 5, wherein the lens back surface comprises at least one circular convex bump.

8. The lens structure of claim 1, wherein the two or more concave circular dimples comprise a first concave circular dimple centered on the front surface and two or more second concave circular dimples, wherein the diameter of the first concave circular dimple is less than the diameters of the second concave circular dimples.

9. The lens structure of claim 1, wherein the backend front surface and the lens back surface are configured to facilitate total internal reflection of luminous flux received by the backend from the light source.

10. The lens structure of claim 1, wherein the backend front surface is coupled to the lens back surface.

11. A luminaire comprising:

a light source;

a lens comprising a lens back surface configured to receive an input luminous flux and an opposing lens front surface configured to emit an output luminous flux, wherein the lens back surface comprises a convex circular dimple; and a backend comprising a backend back surface and a backend front surface, the backend configured to receive a luminous flux from the light source and to redirect the received luminous flux onto the lens, the redirected luminous flux configured to increase a luminous efficacy of the luminaire, wherein the backend front surface is adjacent to and contiguous with the convex circular dimple of the lens back surface;

wherein the lens front surface comprises two or more concave circular dimples.

12. The luminaire of claim 11, wherein the backend back surface is configured to reflect at least a portion of the received luminous flux onto the back surface of the lens.

13. The luminaire of claim 11, wherein the backend back surface is configured to refract at least a portion of the received luminous flux and, via total internal reflection, is configured to transmit the refracted luminous flux into the lens.

14. The luminaire of claim 11, wherein the lens is configured to receive a portion of the luminous flux from the light source directly from the light source.

15. The luminaire of claim 11, wherein the lens front surface comprises four concave circular dimples.

16. The luminaire of claim 15, wherein the lens front surface comprises a circular concave mid-dimple disposed in the center of the four concave circular dimples, which are arranged in a square pattern.

17. The luminaire of claim 15, wherein the lens back surface comprises at least one circular convex bump.

18. The luminaire according to claim 11, wherein the light source comprises at least one light emitting diode (LED).

19. The luminaire according to claim 11, further comprising a layer coupled to the front surface of the lens, the layer configured to provide a smooth outer surface.

20. The luminaire according to claim 11, wherein the lens and the backend are produced in a three-dimensional (3D) printing process.

* * * * *